Figure 1:
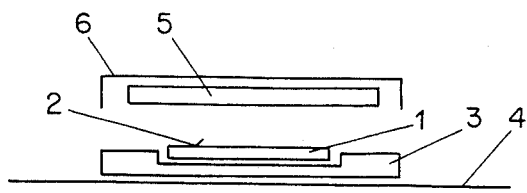

United States Patent [19]

Keser et al.

[11] Patent Number: 4,720,469

[45] Date of Patent: Jan. 19, 1988

[54] METHOD FOR DIFFUSING ALUMINUM

[75] Inventors: Helmut Keser, Birr; Jan Voboril, Nussbaumen, both of Switzerland

[73] Assignee: BBC Brown, Boveri & Company, Limited, Baden, Switzerland

[21] Appl. No.: 850,541

[22] Filed: Apr. 11, 1986

[30] Foreign Application Priority Data

Jun. 10, 1985 [DE] Fed. Rep. of Germany ....... 3520699
Oct. 12, 1985 [EP] European Pat. Off. ......... 85112967.6

[51] Int. Cl.$^4$ .......................................... H01L 21/385
[52] U.S. Cl. ..................................... 437/143; 437/160
[58] Field of Search .......................... 148/188, 1.5, 186; 29/576 B

[56] References Cited

U.S. PATENT DOCUMENTS

| | | | |
|---|---|---|---|
| 2,989,385 | 6/1961 | Gianola et al. | 148/1.5 X |
| 3,718,502 | 2/1973 | Gibbons | 148/188 X |
| 4,199,386 | 4/1980 | Rosnowski et al. | 148/188 |
| 4,290,830 | 9/1981 | Mochizuki et al. | 148/187 |
| 4,348,254 | 9/1982 | Lindmayer | 148/186 X |
| 4,354,307 | 10/1982 | Vinson et al. | 29/571 |
| 4,381,957 | 5/1983 | Punter et al. | 148/188 |
| 4,565,588 | 1/1986 | Seki et al. | 148/186 |

*Primary Examiner*—George T. Ozaki
*Attorney, Agent, or Firm*—Oblon, Fisher, Spivak, McClelland, & Maier

[57] ABSTRACT

For the p-type doping of silicon, particularly for power semiconductor components, aluminum from an Al target is precipitated by cathode sputtering in an argon plasma on a major face (2) of a silicon wafer (1) by which means a comparatively high purity of the deposited aluminum is achieved. Before the aluminum deposition, the silicon water (1) is bombarded with argon ions for 10 min at an argon pressure of 20 μbar which guarantees a uniform fusion of the aluminum with the silicon during later heating and, in particular, prevents the formation of droplets of the aluminum on the major face (2). The Al layer formed in this manner is photo-lithographically preferably structured in such a manner that several aluminum sources spaced apart from each other are allocated to one aluminum-doped zone (10). The subsequent diffusion occurs for 300 min at 1250° C. in a gas mixture of nitrogen or argon (1 l/min) and oxygen (20 ml/min). During this process, the aluminum-doped zone (10) is produced. Subsequently, photoresist (13,14) is applied to the non-diffused regions. Residues (11') of the aluminum sources are then laterally etched by a silicon etchant and, as a result, removed. Following this, the photoresist (13,14) is removed.

19 Claims, 18 Drawing Figures

METHOD FOR DIFFUSING ALUMINUM

The invention is based on a method for producing a semiconductor arrangement. The invention also relates to a semiconductor arrangement.

In the precharacterizing clause, the invention refers to a state of the art of methods for producing a semiconductor arrangement as described in German Auslegeschrift 2,812,658 which corresponds to U.S. Pat. No. 4,290,830. In this document, aluminum is deposited in a grid-shaped pattern in a thickness of less than b 2 μm from an aluminum wire having a purity of 99.9995% as aluminum source onto a major face of a single-crystal silicon semiconductor substrate. The aluminum wire is heated by an electron beam and the aluminum is deposited on the silicon substrate heated to 230° C.–250° C. at a pressure within a range of 270 μPa to 400 μPa and is photo-lithographically structured in the usual manner. The Si substrate is heated in an atmosphere of a non-oxidizing gas such as nitrogen or argon and 0.05–10% by volume of oxygen until a coherent oxide layer forms on the aluminum and silicon surface. The disadvantage of this is that due to the electron beam, the environment of the irradiated aluminum wire also rises to a high temperature which can lead to vaporization, for example, of crucible material and thus to undesirable contamination of the vapor-deposited aluminum layer.

Difficulties occur when the silicon wafer coated with aluminum is heated up since the Al-Si melt is not uniformly distributed on the Si surface because of an intermediate layer which becomes apparent as a formation of small droplets. As a result, the homogeneity of the diffusion is not guaranteed.

Aluminum, which has a large diffusion constant in silicon, is one of the most important doping substances for producing power semiconductor components such as diodes and thyristors.

It is of advantage for edge contouring, that is to say the shaping of the edge of a semiconductor component such as is required for high-voltage components, if the blocking pn junction, carrying the total voltage in the blocking direction, is pulled lower at the edge or if a so-called protective ring can be formed. For field-controlled thyristors, a deeper pn junction must be diffused for which a deep selective p-type diffusion is necessary. With respect to the required penetration depth of this diffusion, virtually only aluminum can be used as doping substance since the diffusion constant of boron or gallium is too small. The diffusion constant of aluminium is about 10 times as large as that of boron. Although gallium diffuses slightly more rapidly in comparison with boron, it cannot be masked. The problem of selective Al diffusion has not yet been satisfactorily solved.

The invention achieves the object of specifying a simplified method for producing a semiconductor arrangement by means of which it is possible to adjust for a deep aluminum-doped zone in a silicon substrate with high selectivity.

An advantage of the invention consists in that contamination-free aluminum layers can be applied to the surface of the silicon wafer. A higher purity of the aluminum on the silicon substrate can be achieved and the proportion of contaminations by foreign atoms, particularly by heavy-metal atoms, can be reduced.

An advantage of sputtering in a rare gas consists in the fact that no reaction products can be produced in the gas plasma.

The rare-gas bombardment has the advantage that the aluminum layer subsequently applied adheres well to the base and uniformly fuses with the silicon so that no droplet formation of the aluminum occurs on the silicon surface.

A diffusion protection layer applied prevents undesirable foreign atoms from being diffused into the silicon.

An advantage of maintaining the temperature conditions consists in the fact that the desired deep pn junction can be adjusted with good reproducibility.

The lateral etching has the advantage that there is no mechanical removal of the residues of the aluminum sources by grinding and polishing the upper major face of the silicon wafer and the smooth surface of the undoped regions is retained.

An additional advantage consists in the fact that the lateral etching can be used for relatively large-area doping zones.

Using an etchant with isotropic action has the effect that the etching depth can be kept relatively small.

A masked application of photoresist has the advantage that only the areas of the aluminum sources are etched and the remaining areas are retained in their polished condition.

The semiconductor arrangement has the advantage that it can be produced by relatively simple means.

Regarding the relevant state of the art, additional reference is made to U.S. Pat. No. 4,199,386 from which it is known to apply to complicated structure of several layers to the silicon wafer, which structure is then structured and is used as diffusion source.

From European Patent No. B1 0,054,317 which corresponds to U.S. Pat. No. 4,381,957, it is known to use several aluminum sources having dimensions of approximately 6 μm × 6 μm for generating an aluminum-doped region in an n-conducting silicon layer. The aluminum sources are mutually spaced apart by about 4 μm and have a thickness of $\geq 0.5$ μm or, after a preceding grain boundary etching, a thickness of $\leq 0.2$ μm. Before the diffusion treatment carried out in an oxidizing atmosphere (10 hrs. at 1200° C.), an etching of 30 sec. duration is performed in a solution of hydrogen fluoride in water, during which oxide is removed from the surface of the parts. There is no information how the residues of the aluminum sources remaining after the diffusion treatment, particularly the aluminum oxide produced thereupon, are removed.

Figure 2:
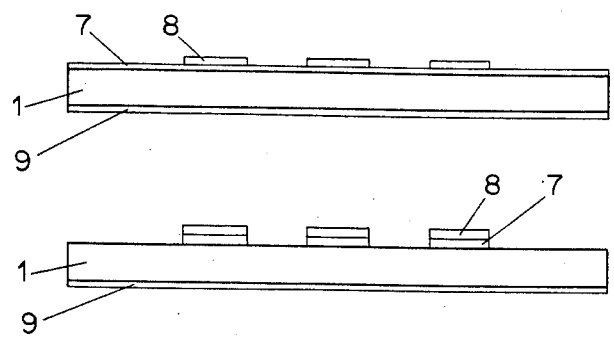
Figure 3:
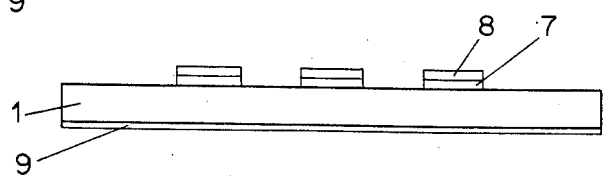
Figure 4:
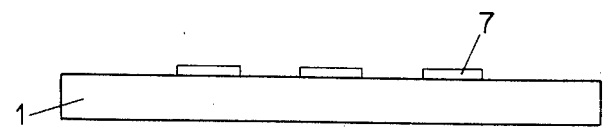
Figure 5:
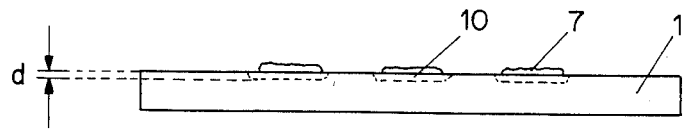
Figure 6:
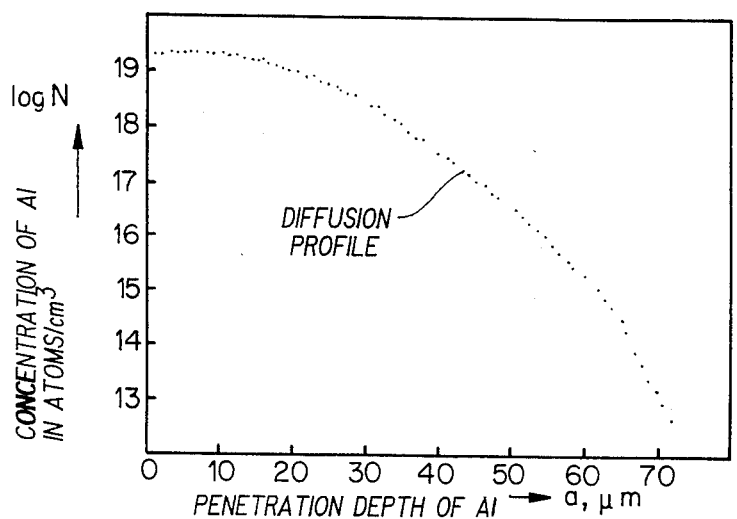
Figure 7:
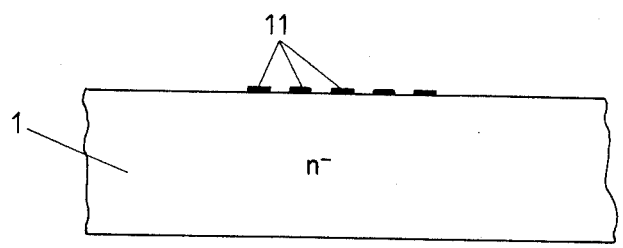
Figure 8:
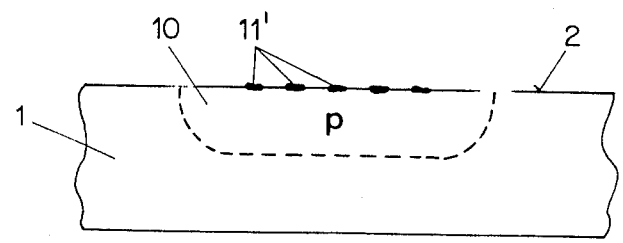
Figure 9:
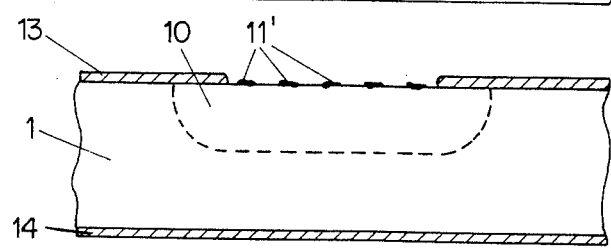
Figure 10:
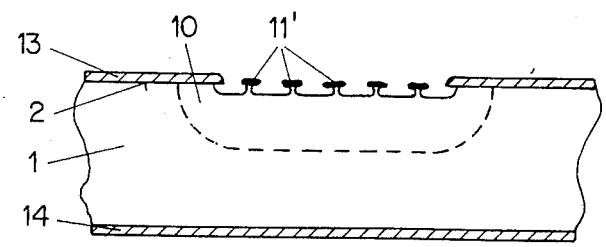
Figure 11:
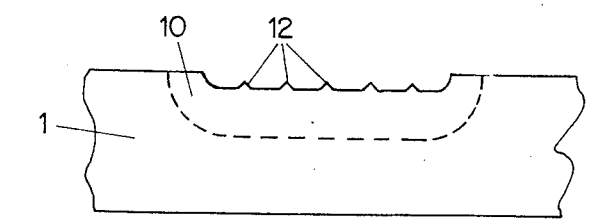
Figure 13:
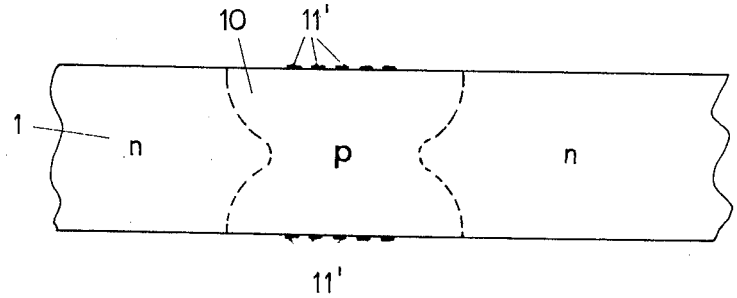
Figure 12:
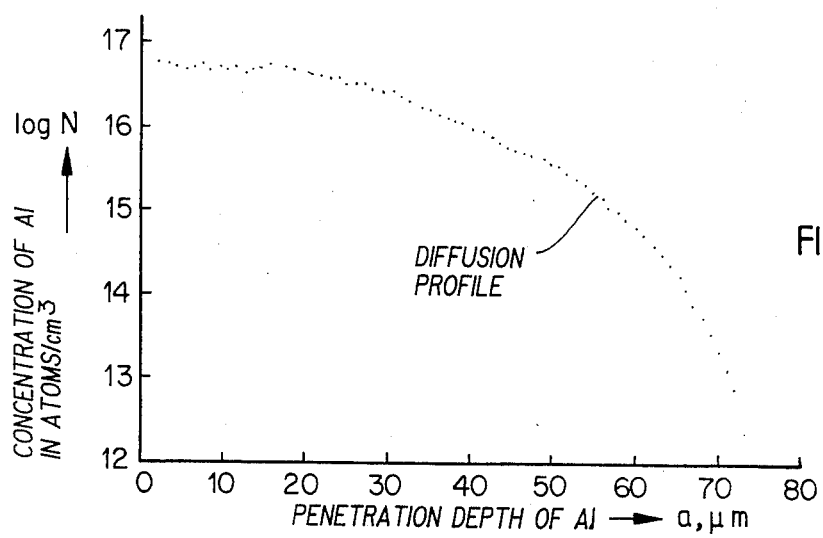
Figure 14:
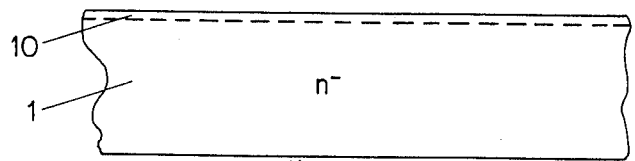
Figure 15:
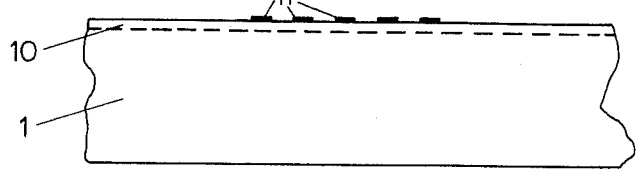
Figure 16:
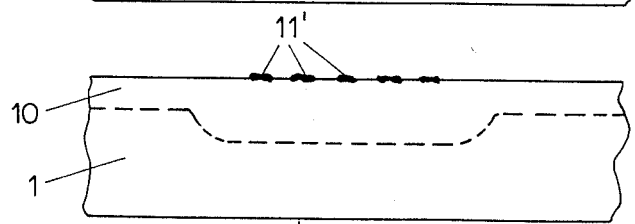
Figure 17:
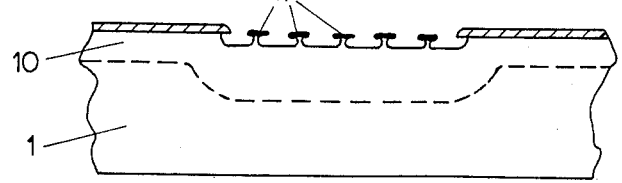
Figure 18:
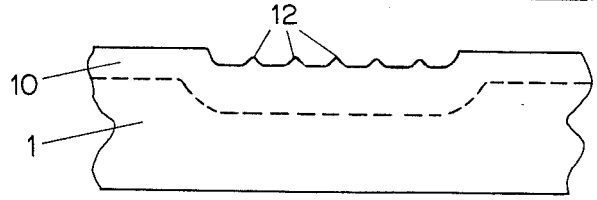

In the text which follows, the invention is explained with the aid of illustrative embodiments, in which:

FIG. 1 shows an arrangement for coating a silicon wafer with aluminum,

FIG. 2 shows a silicon wafer according to FIG. 1 which is coated with aluminum and photoresist, FIG. 3 shows a silicon wafer according to FIG. 2 after the aluminum has been etched away, FIG. 4 shows a silicon wafer according to FIG. 3 after removal of the photoresist, FIG. 5 shows a silicon wafer according to FIG. 4 with aluminum-doped zones after a diffusion in an oxygen-containing atmosphere, FIG. 6 shows a diffusion profile through an aluminum-doped zone according to FIG. 5, FIG. 7 shows a section of a silicon wafer with several aluminum sources for producing an aluminum-doped zone, FIG. 8 shows a silicon wafer according to FIG. 7 after the diffusion treatment with an aluminum-doped zone, FIG. 9 shows a silicon wafer according to FIG. 8 with a masked photoresist coating, FIG. 10 shows a silicon wafer according to FIG. 9 during a silicon etching treatment, FIG. 11 shows a silicon wafer according to FIG. 10 after the silicon etching treatment and after removal of the photoresist, FIG. 12 shows a diffusion profile through an aluminum-doped zone according to FIG. 11, FIG. 13 shows an arrangement of aluminum sources on a silicon wafer, shown in section, for carrying out an isolation diffusion, FIG. 14 shows a silicon wafer, shown in section, having a flat $p^+$-type zone, FIG. 15 shows a silicon wafer according to FIG. 14, having several aluminum sources for producing a locally deep $p^+$-type zone, FIG. 16 shows a silicon wafer according to FIG. 15 after the diffusion treatment, FIG. 17 shows a silicon wafer according to FIG. 16 during a silicon etching treatment, and FIG. 18 shows a silicon wafer according to FIG. 17 after the silicon etching treatment and after removal of the photoresist.

In FIG. 1, 1 designates a silicon wafer or a silicon substrate the upper major face 2 of which is polished and is to be coated with aluminum. The silicon wafer 1 of n-conducting type has a diameter of 50.8 mm and a specific resistance within a range of $40\Omega$ cm–$60\Omega$ cm. It is located on a support disc 3 of silicon so that it does not come into contact with the turntable 4 of a commercially available high-vacuum cathode sputtering system when being coated with aluminum in this system. 5 designates an aluminum baffle plate or an Al target which is connected as cathode and is sputtered. This Al target 5 is shielded by a shield electrode 6.

In the plasma of a rare gas, preferably in an argon plasma, the Al target 5 is sputtered by ion bombardment and an aluminum coating or an aluminum layer 7 of predeterminable thickness of, for example, 1 $\mu$m is deposited on the silicon wafer 1; see FIG. 2. In this connection, it is of great significance that the Si surface is bombarded with Ar ions at 20 $\mu$bar argon pressure for about 10 minutes before the sputtering which leads to the removal of the silicon layer and the $SiO_2$ skin located on it (native oxide). This guarantees direct contact between Al and Si without the interfering isolating layer and this deposited Al layer uniformly fuses with the silicon.

If the aluminum layer 7 were only sputtered on without prior removal by bombardment of the major face 2 with Ar ions, an undesirable droplet formation of the aluminum could occur on the major face 2 during a subsequent diffusion and small areas of the major face 2 could remain without an aluminum layer.

The sputtering occurs at an argon pressure 8 $\mu$bar with a rate of deposition of 3.4 Å/sec. up to a thickness of 1 $\mu$m of the layer. In comparison with vapor deposition, it is a relatively cold process which contributes to the cleanliness of the substance applied since no boat or crucible is heated up which represents a source of contamination. Contamination by the turntable 4 on which the silicon wafer 1 is resting in the sputtering system can be prevented by placing underneath the silicon wafer 1 the silicon support disc 3 which is slightly larger. This support disc 3 has a recess in the center in which the silicon wafer 1 to be treated is located and cannot slip away.

After sputtering, the aluminum layer 7 is photo-lithographically masked in the usual manner and a dot-shaped commercially available photoresist coating 8 is applied. Photoresist can be obtained, for example with the number AZ-1350 J-SF from the German manufacturer Höchst. Suitably a photoresist coating 9 is also applied to the reverse side of the silicon wafer 1 to prevent the silicon wafer from being contaminated during later manipulation.

After the photoresist coatings 8 and 9 have been applied, the aluminum is etched for 30 sec. at 55° C. in an ISOFORM aluminium etchant by M.I.T.-Halbleiter-Chemie-GmbH, Solingen, Germany, so that the structure shown in FIG. 3 is produced. A mixture of the following composition can be used as aluminum etchant:

75 ml 85% phosphoric acid $H_3PO_4$,
10 ml water, $H_2O$,
5 ml 98% acetic acid, $CH_3COOH$,
3 ml 65%–70% nitric acid, $HNO_3$ and, if necessary,
1 ml wetting agent (e.g., Triton).

Subsequently, the photoresist, no longer needed, is removed with acetone and isopropanol for 15 sec. each in an ultrasonic bath, and the silicon wafer 1 is rinsed with water and dried so that the structure shown in FIG. 4 is produced.

The adhesion of the aluminum can now be further improved by tempering for 30 min in a vacuum at 480° C.–500° C.: but it is of subordinate significance in comparison with an $Ar^+$ bombardment, which was confirmed by experiments.

The subsequent diffusion of the aluminum coatings 7 into the silicon wafer 1 occurs for 300 min. at a temperature of 1250° C. in a gas mixture of $N_2$ (1 l/min.) and $O_2$ (20 ml/min.), the rate of heating being 3° K./min. Cooling is carried out at a rate of cooling of 1° K./min.

The oxygen has the job of converting the aluminum vapors from the aluminum layer into aluminum oxide $Al_2O_3$.

$Al_2O_3$ is ineffective as a diffusion source and cannot generate a p-type layer on undesirable locations. Instead of nitrogen, argon can also be used. The regions in which no diffusion is to take place can be additionally provided with an $SiO_2$ layer as diffusion barrier against the other doping substances present in the tube or already in the silicon wafer.

After the diffusion, the remaining Al, $Al_2O_3$, the melt of Al-Si and possibly $SiO_2$ can be etched and polished away. Removal during polishing is slight in comparison with the removal by the prior Al loading.

If a lower edge concentration is desired, this can now be followed by a so-called drive-in diffusion.

During the diffusion, aluminum atoms diffuse into the interior of the silicon wafer 1 up to a diffusion depth d and there form a $p^+$-type doped zone 10 in the n-conducting silicon, see FIG. 5.

The resultant diffusion profile under an aluminum layer 7 is shown in FIG. 6 in which the penetration depth a of the aluminum atoms is plotted in $\mu$m along the abscissa and log N is plotted along the ordinate, N=Al concentration=number of Al atoms/$cm^3$. The concentration N decreases with increasing penetration depth a from the major face 2. No p-type doping was found on the regions without aluminum layer 7.

For producing field-controlled thyristors, deeply diffused p-type regions with penetration depths of $\geq 50$ $\mu$m and preferably of 75 $\mu$m and edge concentrations within a range from $10^{16} cm^{-3}$–$10^{17} cm^{-3}$ are needed.

The deeply diffused p-type regions delimit the component. Only this makes edge contouring of the high-reverse-voltage pn junction possible. The surface of the semiconductor component must be polished, at least on the non-doped regions to ensure good placement of the mask during masking and to be able to achieve the fine structure of the component.

The production process comprises the following steps:

1. Applying and structuring an Al layer on the Si surface as described in conjunction with FIGS. 1-4. However, the thickness of the structure is considerably smaller in comparison with the penetration depth of the subsequent diffusion, preferably less than ⅓ of the penetration depth. Several aluminum sources 11 having a thickness of 25 μm, see FIG. 7, are allocated to one aluminum-doped zone 10 according to FIG. 8. The aluminum sources 11 can have a circular, rectangular, strip-shaped or other cross-section. A square cross-section of about 10 μm edge length is preferably used.

2. Diffusion within the range of 1200° C.-1300° C. in a gas mixture of $N_2$ and up to 10% by volume of $O_2$ until the desired penetration depth has been reached (300 min). Heating at 3° K./min., cooling at 1° K./min. After the diffusion, residues 11' of the aluminium sources 11 remain, see FIG. 8, which project by about 2 μm-3 μm at the major top surface 2 of the silicon wafer 1 and have aluminum oxide $Al_2O_3$ on the surface.

3. Application of a photoresist coating 13 to the non-diffused regions of the Si surface and of a whole-area photoresist coating 14 to the reverse side of the silicon wafer 1, see FIG. 9. In this process, a photoresist is used which is available with the number SC-450 from the American firm of Hunt Chemical Corporation.

4. Lateral etching of the residues 11' of the aluminum source 11. The residues 11', which have remained in the form of aluminum oxides and nitrides on the silicon surface, cannot be removed by wet chemical means. To remove them, a silicon etchant, preferably sulphur hexafluoride, $SF_6$, or an etching mixture of 230 ml hydrofluoric acid HF,
470 ml nitric acid $HNO_3$,
200 ml acetic acid $CH_3COOH$,
100 ml phosphoric acid $H_3PO_4$, is used at a bath temperature within a range from 2° C.-4° C. for about 2 min to 3 min which etches the silicon. This silicon etchant attacks the silicon through the openings in the residual aluminum layers on the areas not protected with photoresist 13 or 14. With the etchant having an isotropic affect, the structure is laterally etched as shown in FIG. 10. Finally, the residues 11' of the aluminum sources 11 are separated and flushed away with the etchant. Below the location of the removed aluminum sources 11, pyramid- or cone-shaped raised parts 12 remain in the surface of the aluminum-doped zone 10 which impart a rippled appearance to this zone, see FIG. 11.

5. Removal of the photoresist layers 13 and 14 in fuming nitric acid, $HNO_3$, see FIG. 11.

Only conventional steps are used in this method. The flowing together of the Al-Si melt is largely prevented. Thicker Al layers may be used without danger and very large penetration depths can be achieved during the diffusion. No losses or damage are produced on the undoped Si surface. Since the surface is recessed in the undoped regions, it does not represent any danger for a mask during subsequent photo-lithographical processes. During the etching out of the Al residues after the diffusion, the silicon layer is also removed which is stressed during the solidification of the Al-Si melt during the cooling and could act as a source for crystal defects during the subsequent high-temperature processes.

In comparison with a compact unstructured Al layer, the structure described is a weaker diffusion source since during the diffusion the aluminum is also diffused out through the openings in the Al layer. But this can be used for adjusting the desired variation of the doping profile by changing the ratio between the Al-coated and the uncoated area.

FIG. 12 shows an Al concentration profile, corresponding to FIG. 6, through a p-type doped zone 10 in FIG. 11 from which can be seen that an Al concentration N of $10^{12}$ Al atoms/$cm^3$ still exists at a penetration depth a of about 73 μm, and one of about $8 \times 10^{16}$ Al atoms/$cm^3$ at the surface.

FIG. 13 shows the application of the method described in conjunction with FIGS. 7-11 to isolation diffusion in which the aluminum diffuses from the aluminum sources 11' from both major faces of the silicon wafer 1 into this wafer until a continuous p-type doped zone 10 is generated. During isolation diffusion, the formation of droplets and the deliquescence of the structure usually represent the greatest problems.

In FIGS. 14-18, the generation of an internal contouring, that is to say of a deep p-type diffusion with locally dependent penetration depth is shown as a further possible application.

Other possible applications can be all the processes in which the uniform melting of the silicon with the aluminum is of significance which is the case, for example, with migration.

We claim:

1. A method for producing a semiconductor device with at least one deep, laterally limited $p^+$-type doped zone comprising the following steps:
    (a) bombarding a major face of a silicon wafer with rare gas ions, thereby enhancing the adhesion of a subsequently deposited aluminum layer on said major face,
    (b) depositing an aluminum layer on said major face by cathode sputtering in a non-corroding gas plasma,
    (c) structuring said aluminum layer according to a predeterminable pattern for the purpose of generating at least one deep, laterally limited $p^+$-type doped zone, and
    (d) heating silicon wafer coated with said aluminum layer in an oxygen containing atmosphere to a diffusion temperature for a time sufficient to diffuse aluminum from the aluminum layer into the silicon wafer to produce said $p^+$-type doped zone.

2. The method according to claim 1 wherein the structuring of the aluminum layer divides the aluminum layer up into a plurality of separate aluminum sources.

3. The method according to claim 2, further comprising
    (e) removing a residue of the aluminum sources by isotropically etching said major face inbetween the residues of the aluminum sources by a silicon etchant, so as to remove the support of the residues of the aluminum sources.

4. The method according to claim 3, wherein said rare gas ions are argon ions and wherein said non-corroding gas plasma is an argon plasma.

5. The method according to claim 4, further comprising tempering said silicon wafer coated with aluminum sources at a temperature between 480° C. and 500° C. before said heating step.

6. The method according to claim 5, wherein said heating step comprises
    (a) raising the temperature at a rate of about 3° K./min to a diffusion temperature of 1250° C.,
    (b) keeping the temperature at 1250° C. for about 300 min, and
    (c) lowering the temperature at a rate of 1° K./min.

7. The method according to claim 6 further comprising the additional step of
    covering the whole silicon wafer except for the p+-type doped zones with a photoresist coating before said removing step.

8. The method according to claim 7, wherein the silicon etchant to remove the residue of the aluminum sources consists of
    23% by volume HF
    47% by volume HNO$_3$
    20% by volume CH$_3$COOH
    10% by volume H$_3$PO$_4$.

9. A method for producing a semiconductor device with at least one deep, laterally limited p+-type doped zone comprising the following steps:
    (a) bombarding a major face of a silicon wafer with rare gas ions, thereby enhancing the adhesion of a subsequently deposited aluminum layer on said major face,
    (b) depositing an aluminum layer on said major face by cathode sputtering in a non-corroding gas plasma,
    (c) structuring said aluminum layer for the purpose of generating at least one deep, laterally limited, p+-type doped zone according to a predeterminable pattern whereby said aluminum layer is divided up into a plurality of separate sources, and
    (d) heating the silicon wafer coated with said aluminum sources in an oxygen containing atmosphere to a diffusion temperature for a time sufficient to diffuse aluminum from the aluminum sources into the silicon wafer to produce said p+-type doped zone.

10. The method according to claim 9, further comprising
    (e) removing a residue of the aluminum sources by etching the major face of the diffused silicon wafer inbetween the residues of the aluminum sources by a silicon etchant, so as to remove the support of the residues of the aluminum sources.

11. The method according to claim 10, wherein said rare gas ions are argon ions and wherein said non-corroding gas plasma is an argon plasma.

12. The method according to claim 11, further comprising
    tempering said silicon wafer coated with aluminum sources at a temperature between 480° C. and 500° C. before heating it to said diffusion temperature.

13. The method according to claim 12, wherein said heating step comprises
    (a) raising the temperature at a rate of about 3° K./min to a diffusion temperature of 1250° C.,
    (b) keeping the temperature at 1250° C. for about 300 min, and
    (c) lowering the temperature at a rate of 1° K./min.

14. The method according to claim 3 further comprising
    covering the whole silicon wafer except for the p+-type doped zones with a photoresist coating before said removing step.

15. A method for producing a semiconductor device with at least one deep, laterally limited p+-type doped zone comprising the following steps:
    (a) bombarding a major face of a silicon wafer with rare gas ions, thereby enhancing the adhesion of a subsequently deposited aluminum layer on said major face,
    (b) depositing an aluminum layer on said major face by cathode sputtering in a non-corroding gas plasma,
    (c) structuring said aluminum layer for the purpose of generating at least one deep, laterally limited, p+-type doped zone according to a predeterminable pattern, whereby said aluminum layer is divided up into a plurality of separate aluminum sources,
    (d) heating the silicon wafer coated with said aluminum sources in an oxygen containing atmosphere to a diffusion temperature for a time sufficient to diffuse aluminum from the aluminum sources into the silicon wafer to produce said p+-type doped zone, and
    (e) removing a residue of the aluminum sources by isotropically etching said major face after the diffusion treatment of the silicon wafer inbetween the residues of the aluminum sources by a silicon etchant, so as to remove the support of the residues of the aluminum sources.

16. The method according to claim 15, wherein said rare gas ions are argon ions and wherein said non-corroding gas plasma is an argon plasma.

17. The method according to claim 16, further comprising
    tempering said silicon wafer coated with aluminum sources at a temperature between 480° C. and 500° C. before said heating step.

18. The method according to claim 17, wherein said heating step comprises
    (a) raising the temperature at a rate of about 3° K./min to a diffusion temperature of 1250° C.,
    (b) keeping the temperature at 1250° C. for about 300 min, and
    (c) lowering the temperature at a rate of 1° K./min.

19. The method according to claim 18 further comprising the additional step of
    covering the whole silicon wafer except for the p+-type doped zones with a photoresist coating before said removing step.

* * * * *